(12) United States Patent
Hsu

(10) Patent No.: US 7,199,009 B2
(45) Date of Patent: Apr. 3, 2007

(54) METHOD FOR FABRICATING POWER MOSFET

(75) Inventor: Hsiu-Wen Hsu, Hsinchu (TW)

(73) Assignee: Episil Technologies Inc., Hsinchu City (TW)

( * ) Notice: Subject to any disclaimer, the term of this patent is extended or adjusted under 35 U.S.C. 154(b) by 92 days.

(21) Appl. No.: 10/906,166

(22) Filed: Feb. 5, 2005

(65) Prior Publication Data

US 2006/0084209 A1    Apr. 20, 2006

(51) Int. Cl.
*H01L 21/336* (2006.01)
(52) U.S. Cl. .................. 438/268; 438/138; 438/156
(58) Field of Classification Search ................ 438/138, 438/151, 156, 197, 268, 222–223, 301, 306, 438/173, 192
See application file for complete search history.

(56) References Cited

U.S. PATENT DOCUMENTS 6,049,104 A * 4/2000 Hshieh et al. .............. 257/328
6,153,451 A * 11/2000 Hutter et al. ............... 438/197
6,165,821 A * 12/2000 Boden et al. ............... 438/137
6,773,977 B1 * 8/2004 Reynes et al. .............. 438/237

* cited by examiner

*Primary Examiner*—Thanhha Pham
(74) *Attorney, Agent, or Firm*—Jianq Chyun IP Office

(57) ABSTRACT

A method for fabricating a power MOSFET, comprising an epitaxial layer, a gate dielectric layer and a gate layer formed on a substrate, the gate dielectric layer and the gate layer defined to form a gate structure, a stacked mask and the surface of the epitaxial layer partially exposed between the gate structure and the stacked mask, a well region formed in the epitaxial layer and partially under the gate structure and the stacked mask, a source region is formed in the well region between the gate structure and the stacked mask, a patterned dielectric layer exposing the top of the stacked mask formed over the substrate, the stacked mask removed to form a contact opening exposing the surface of the well region partially and a body region formed in the well region under the contact opening.

14 Claims, 7 Drawing Sheets

METHOD FOR FABRICATING POWER MOSFET

BACKGROUND OF THE INVENTION

1. Field of the Invention

The present invention generally relates to a method of manufacturing the MOSFET (metal oxide semiconductor field effect transistor). More particularly, the present invention relates to a method for fabricating a power MOSFET.

2. Description of Related Art

A power MOSFET can be used to amplify the power, handling the high voltage and the high electric current of the semiconductor devices. The following FIG. 1A to FIG. 1G will explain the prior procedures in fabricating a power MOSFET.

Firstly, referring to the FIG. 1A, a silicon oxide gate dielectric layer 104 and a polysilicon gate layer 106 are formed over a substrate 100 comprising an epitaxial layer 102.

Then, referring to the FIG. 1B, through the process of photolithography and etching, the polysilicon gate layer 106 and the silicon oxide gate dielectric layer 104 are defined to form a gate structure 105. Then, the ion implantation process is carried to form a well region 110 inside the epitaxial layer 102.

Afterwards, further referring to the FIG. 1C, the photoresist layer 112 is formed over the substrate 100 by using spin coating. After the processes of exposure and development, the photoresist layer 112 is patterned to form the patterned photoresist layer 112a as presented in FIG. 1D.

Referring to the FIG. 1E, the patterned photoresist 112a is used as an implanted mask for ion implantation to form a source region 114 inside the well region 110, and then the patterned photoresist layer 112a is removed.

According to the FIG. 1F, a patterned photoresist 116 is formed upon the substrate 100 to cover the gate structure 105 and the source region 114 and expose the surface of the well region 110 that is preserved for the body region. Then the patterned photoresist 116 is used as a mask for ion implantation to form the body region 118 inside the well region 110.

Finally, referring to 1G, a dielectric layer 120 is formed over the substrate 100 to cover the gate structure 105, the source region 114 and the body region 118 after the removal of the patterned photoresist 116. Then, the photolithography and etching processes are performed to form a contact opening 122 in the dielectric layer 120.

From the above mentioned procedures, several photoresist layers are required to define the underneath layer in order to form the gate structure 105, source region 114, body region 118, contact opening 122. That is, for each of these fabrication processes, a photolithography process is needed. Hence, for the common fabrication procedures, at least 5 to 6 photolithography processes are required. However, such complicated procedures will increase the demand for the manpower and the fabrication of the masks cause high costs, not beneficial for cost reduction.

Besides, during the previously mentioned process for forming the source region 114, it is necessary to form the patterned photoresist layer 112a over the substrate 100 (as shown in FIG. 1D) and as mask to enable the ion implantation procedure for forming the source region 114 (as shown in FIG. 1E). However, as the integration of electric devices becomes higher, the critical dimension (CD) becomes smaller. Deviation of the resultant patterns may occur, while the small size of the patterned photoresist layer 112a causes collapse or even peeling for the patterned photoresist layer 112a. Besides, during the formation of source region 114, the patterned photoresist layer 112a is easily damaged by the high current implantor from the ion implantation process, which may result in the imprecise definition.

In addition, during the process to define the photoresist layer 112 in order to form the patterned photoresist layer 112a, if the patterned photoresist 112a for exposing the preserved body region is misaligned, the resultant source region 114 will become asymmetric, thus affecting the following processes.

Furthermore, misalignment can happen during the process for forming the contact opening 122 and consequently causes abnormal electrical connection for transistors, so that the electrical reliability of the devices will decrease.

SUMMARY OF THE INVENTION

Accordingly, the present invention is directed to a method for fabricating a power MOSFET in a self-aligned way, to avoid the asymmetric source region and prevent the abnormal electrical connection of the contact opening due to misalignment.

A method for fabricating a power MOSET is described. First, an epitaxial layer, a gate dielectric layer and a gate layer are formed over a substrate sequentially. The gate dielectric layer and the gate layer are patterned to form a gate structure and a stacked mask structure and a portion of the epitaxial layer is exposed between the gate structure and the stacked mask structure. A well region is formed in the epitaxial layer undera portion of the gate structure and the stacked mask structure. Then, the gate structure and stacked mask structure are used as masks to form a source region in the well region and between the gate structure and the stacked mask structure. Then, a patterned dielectric layer is formed over the substrate to cover the gate structure and the source region, and the patterned dielectric layer exposes the top surface of the stacked mask structure. The stacked mask structure is removed to form a contact opening exposing the surface of a portion of the well region. Then, the patterned dielectric layer is used as a mask to form a body region in the well region and under the contact opening.

According to a preferred embodiment of the present invention, the above mentioned method for forming a patterned dielectric layer over the substrate comprises forming a dielectric layer over the substrate, covering the gate structure, the staked mask structure and the source region. Then, a patterned photoresist layer is formed upon the dielectric layer, and then the dielectric layer which is not covered by the patterned photoresist layer is removed to expose the stacked mask structure. Later on, the patterned photoresist layer is also removed. The method for removing the dielectric layer which is not covered by patterned photoresist layer includes an isotropic etching.

According to the preferred embodiments of the invention, the previous mentioned method for removing the stacked mask structure comprises anisotropic etching or wet etching.

According to the present preferred embodiments of the invention, the materials for the previous mentioned patterned dielectric layer can be silicon oxide, silicon nitride, phosphosilicate glass or borophosphosilicate glass.

According to the preferred embodiments of the invention, the material for the previous mentioned patterned dielectric layer can be borophosphosilicate glass, and a body region is formed below the contact opening and inside the well region. Thereafter, a thermal flow process is further performed to the patterned dielectric layer.

According to the present preferred embodiments of the invention, the methods for defining the gate dielectric layer and the gate layer comprise photolithography and etching technology.

According to the preferred embodiments of the invention, the method for forming the source region comprises ion implantation.

According to the preferred embodiments of the invention, the material for the gate layer comprises polysilicon. Besides, the formation method for gate layer comprises chemical vapor deposition.

According to the preferred embodiments of the invention, the material for gate dielectric layer comprises silicon oxide. Besides, the formation method for the gate dielectrics layer comprises thermal oxidation.

To sum up the previous descriptions, during the formation of the source region in the present invention, the stacked mask structure replaces the common used patterned photoresist as a mask for ion implantation to form the source region. Therefore, the present invention can prevent the patterned photoresist layer from collapsing or peeling or even being damaged by the high electric currents as the line width is reduced. Furthermore, in the present invention, the gate structure and stacked mask structure are formed in the same time, which means the same mask is used for the photolithography and etching process, therefore, the gate structure and the stacked mask structure becomes the masks to form the source region, which will not have the asymmetric problem and further benefit the following processes.

Additionally, the present invention uses the stacked mask structure as the mask to save one mask process during the formation of the source region. Besides, further two masks processes can be waived during the following processes of forming the contact opening and the body region. Therefore, the present invention can reduce the number of masks, the costs of processes and the manpower demands.

On the other hand, the stacked mask structure of the present invention is helpful in forming the body region in a self-aligned way so as to form the body region at the preserved location in the well region. In the same manner, the method is also helpful in accurately defining the position for the contact opening to avoid misalignment and prevent the abnormal electrical connection. Besides, without the needs for preserving the space for misalignment, the present invention can increase the device intensity by reducing the preserved boarder for the source region.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
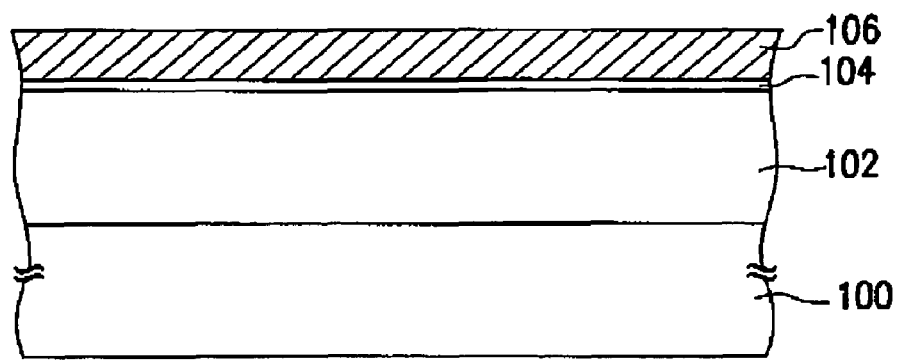
FIG. 1A to FIG. 1G are the cross sectional views for the prior art processes of the power metal oxide semiconductor field effect transistor.
Figure 1B:
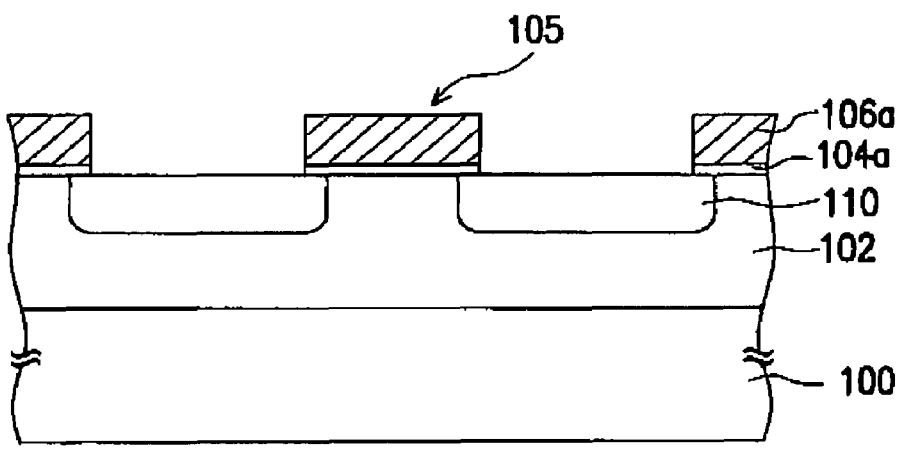
Figure 1C:
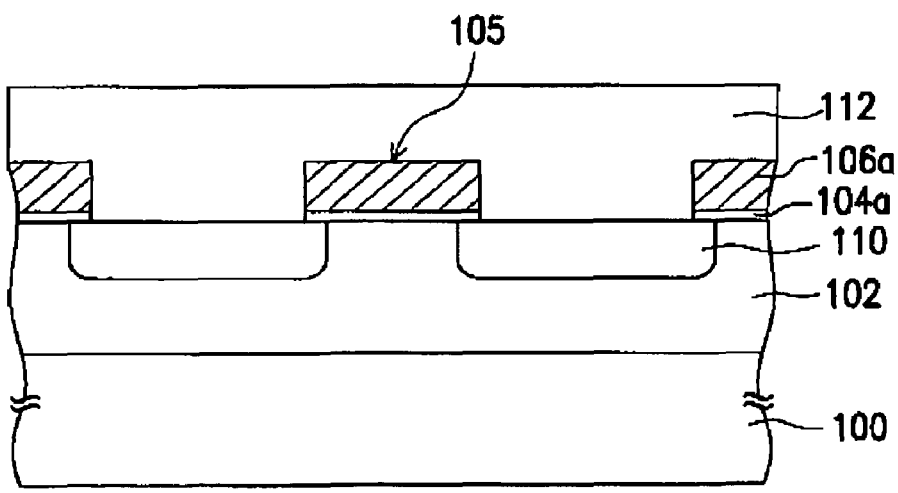
Figure 1D:
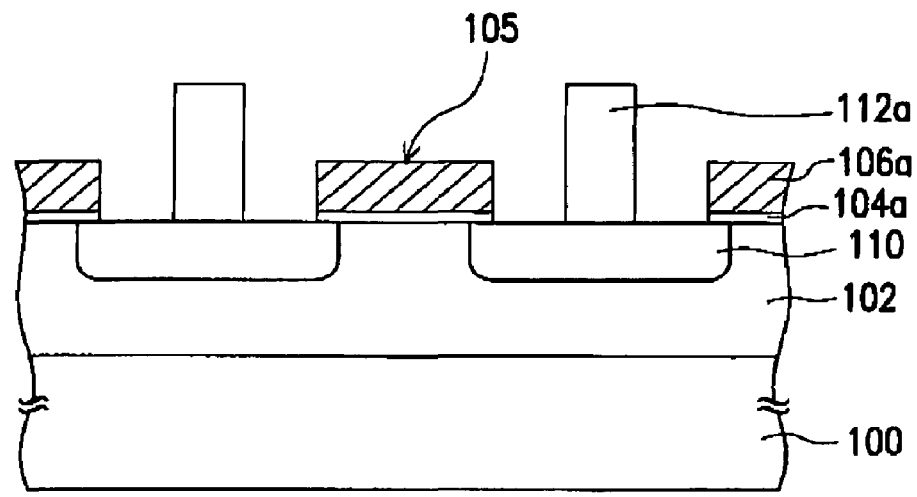
Figure 1E:
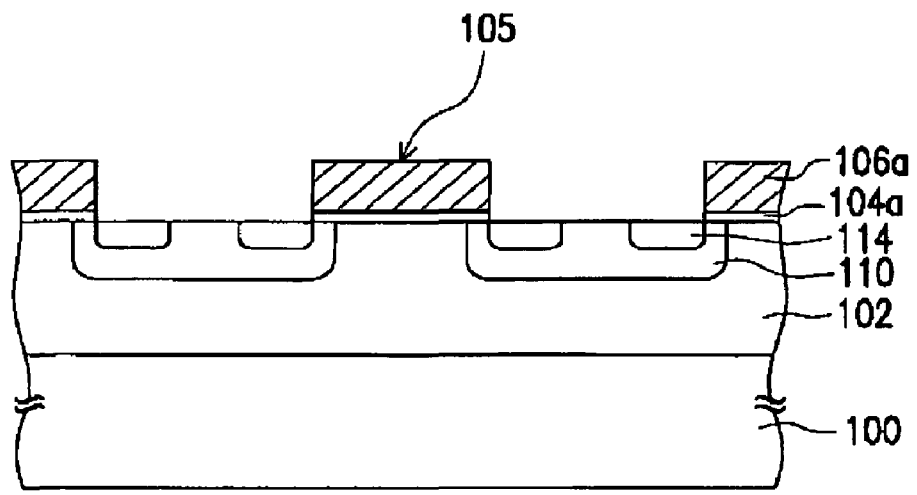
Figure 1F:
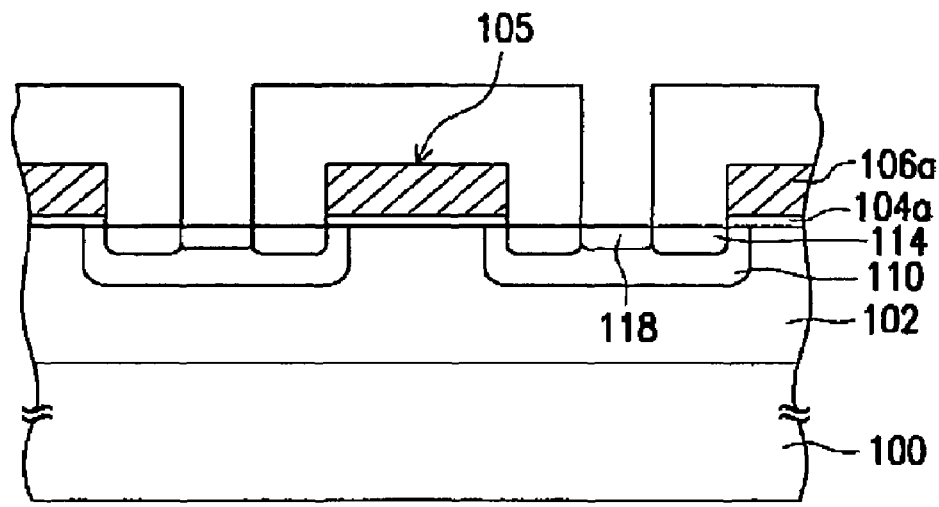
Figure 1G:
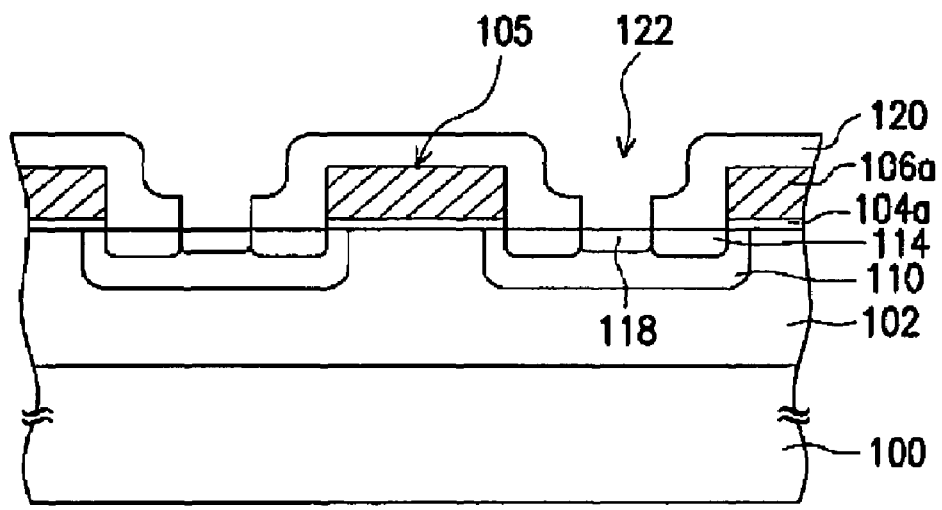

Reference will now be made in detail to the present preferred embodiments of the invention, examples of which are illustrated in the accompanying drawings. Wherever possible, the same reference numbers are used in the drawings and the description to refer to the same or like parts.

The preferred embodiment utilizes a silicon substrate with n-type doping, a n-type epitaxial silicon layer, a p-well and a n-type power metal oxide semiconductor filed effect transistor to describe the present invention. However, the real practice allows the adjustments and modifications and the present invention is not limited by the preferred embodiment.

FIG. 2A to FIG. 2K are cross sectional views of the power metal oxide semiconductor field effect transistor according to the preferred embodiments of the present invention.

Figure 2A:
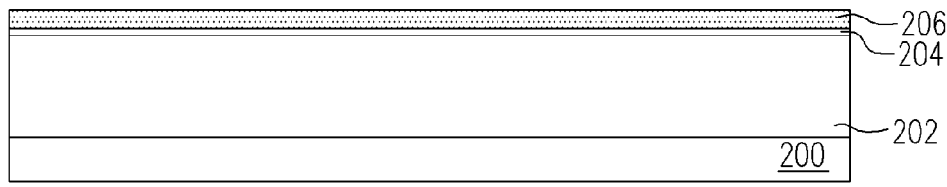
FIG. 2A to FIG. 2K are the cross sectional views of the power metal oxide semiconductor field effect transistor according to the preferred embodiments of the present invention.

First, referring to the FIG. 2A, a substrate 200 comprising an epitaxial layer 202 is provided, and the material for the epitaxial layer 202 is n-type doping silicon, and the doping concentration of the epitaxial layer 202 is lower than that of the substrate 200. Thereafter, a gate dielectric layer 204 and a gate layer 206 are formed over the substrate 200, and the material for the gate dielectrics is, for example, silicon oxide formed by thermal oxidation and the material for gate layer 206 is, for example, polysilicon formed by chemical vapor deposition.

Figure 2B:
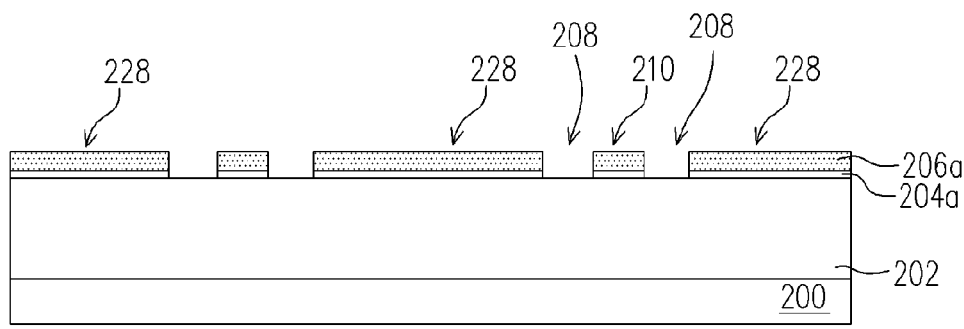

Referring to FIG. 2B, the gate dielectric layer 204 and the gate layer 206 are patterned to form at least a gate structure 228 and a stacked mask structure 210. The epitaxial layer 202 between the stacked gate structure 228 and the stacked mask structure 210 is exposed by the interspaces 208. The gate dielectric layer 204 and the gate layer 206 are formed by, for example, photolithography and etching.

Figure 2C:
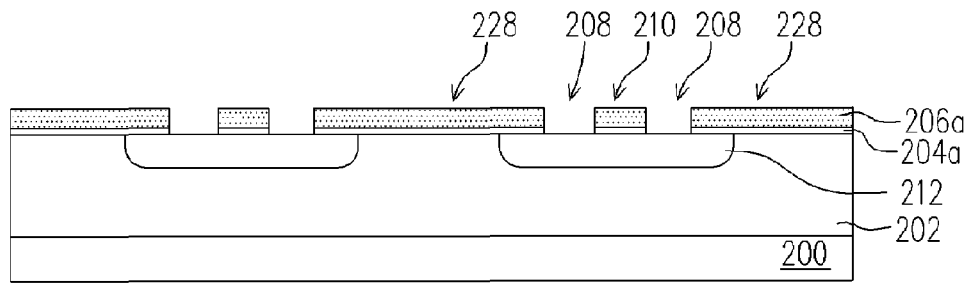

Later on, referring to FIG. 2C, ion implantation is carried out to form the well region 212 inside the epitaxial layer 202 and under a part of the gate structure 228 and the stacked mask structure 210. If the epitaxial layer 202 is, for example, the n-type doping, the well region 212 is preferably doped with p-type boron.

Figure 2D:
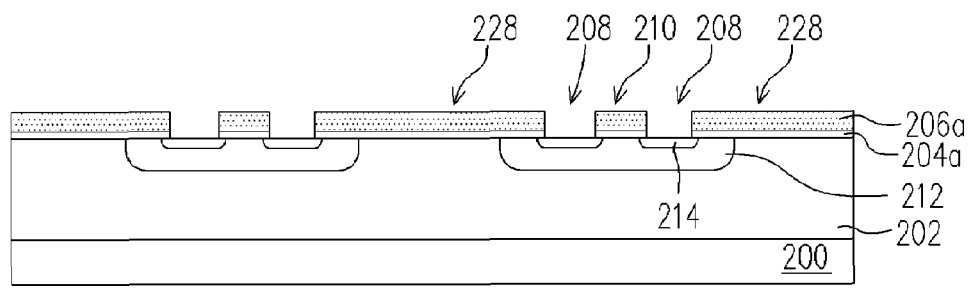

After previous procedure, referring to the FIG. 2D, the gate structure 228 and the stacked mask structure 210 are used as the masks for ion implantation to form the source region 214 inside the well region 212.

Figure 2E:
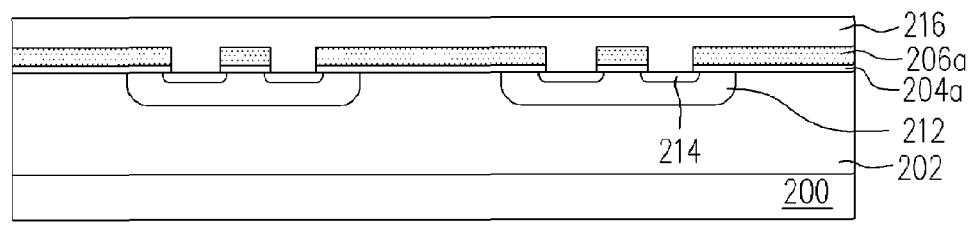

Referring to FIG. 2E, a dielectric layer 216 is formed over the substrate 200. The material for the dielectric layer 216 can be, for example, silicon oxide, silicon nitride, phosphosilicate glass or borophosphosilicate glass, and the method for forming the dielectric layer can be, for example, chemical vapor deposition. If the material for the dielectric layer 216 is the borophosphosilicate glass, the dielectric layer 216 can be formed by depositing a dielectric layer over the substrate 200 by chemical vapor deposition, and then performing the densification process to the dielectric layer.

Figure 2F:
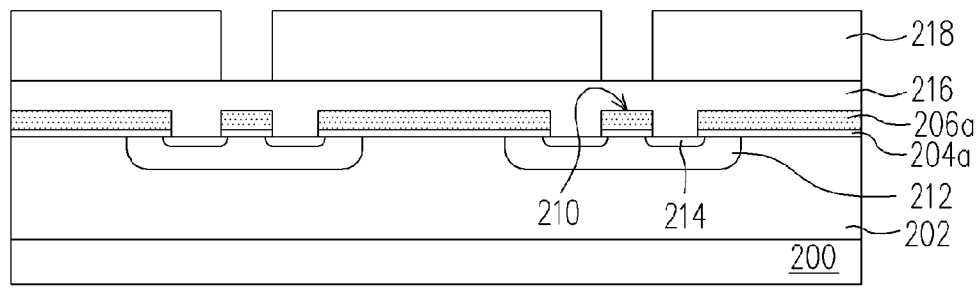

Thereafter, referring to FIG. 2F, a photoresist layer (not shown) is formed upon the dielectric layer 216 and then the photoresist layer is defined to form a patterned photoresist layer 218.

Figure 2G:
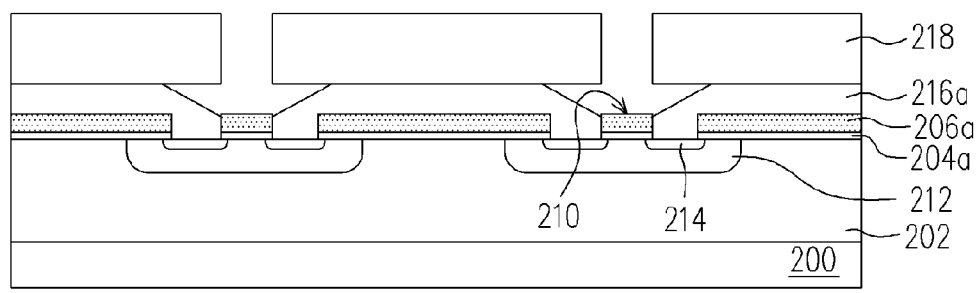

Please further refer to FIG. 2G, the patterned photoresist layer 218 is used as a mask to remove the dielectric layer 216 that is not covered by the patterned photoresist layer 218 to form a patterned dielectric layer 216a. The patterned dielectrics 216a exposes the upper surface of the stacked mask structure 210. Besides, the method for removing the dielectric layer 216 that is not covered by the patterned photoresist 218, for example, includes an isotropic etching process (such as, a wet etching process).

Figure 2H:
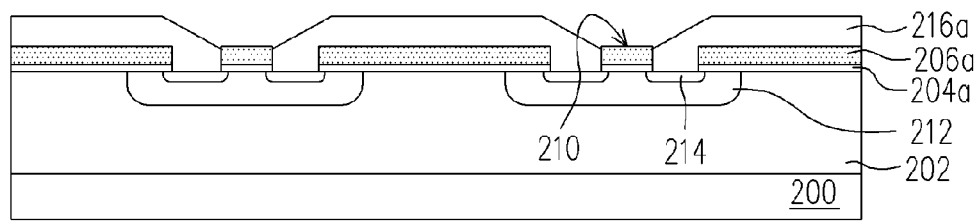

Referring to the FIG. 2H, an etching process is carried out to remove the patterned photoresist layer 218.

Figure 2I:
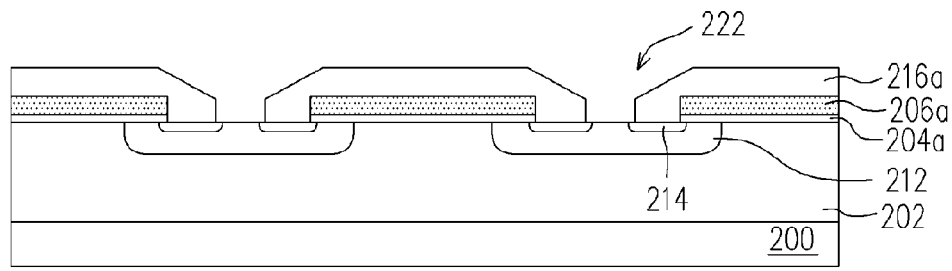

Thereafter, referring to FIG. 2I, at least a contact opening 222 is formed and exposes a portion of the surface of the well region 212 after the removal of the stacked mask structure 210. The method for removing the stacked mask structure 210 includes anisotropic etching or wet etching.

Figure 2J:
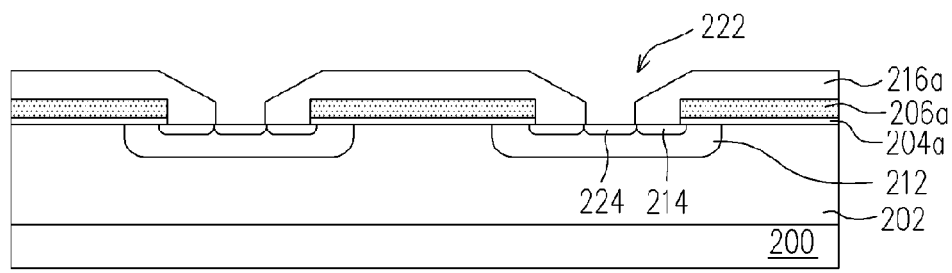
Figure 2K:
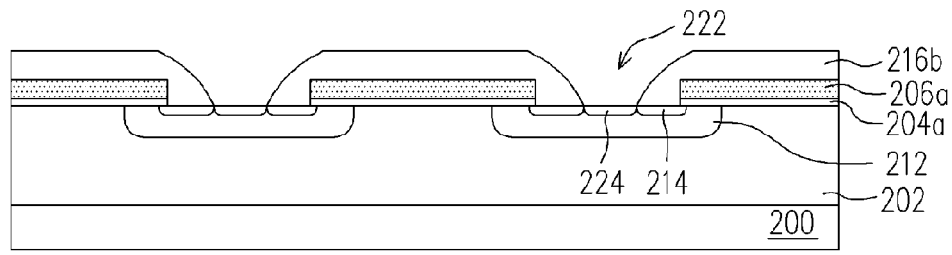

Then, referring to FIG. 2J, using the patterned dielectric layer 216a as a mask for ion implantation to form the body region 224 inside the well region 212 and under the contact opening 222. If the material for the previous mentioned dielectric layer 216 is borophosphosilicate glass, after forming the body region 224, a thermal flow process can be further performed to the patterned dielectric layer 216a, so that both sides of the patterned dielectric layer 216a (i.e., sidewalls of the contact opening 222) become sloping (tilted) and become the patterned dielectric layer 216b as shown in FIG. 2K. It is beneficial for the following processes of the contact.

From above mentioned process, the gate structure 228 and stacked mask structure 210 are formed at the same time, and the stacked mask structure 210 and gate structure 228 are the masks to process continued ion implantation in order to form the source region 214. Unlike the common practice, there is no need to form a patterned mask on the substrate during the formation of a source region. Therefore, the present invention can avoid the collapse or peeling of the photoresist layer while the line width is reduced or prevent the photoresist layer being damage caused by the high electron current.

Besides, the gate structure 228 and the stacked mask structure 210 are formed at the same time by using the same mask for photolithography and etching. By using the gate structure 228 and the stacked mask structure as masks, no asymmetric problems happen for the source region 214, which is beneficial to the following processes.

The present invention uses the gate structure 228 and the stacked mask structure 210 as masks to save one mask during the formation of the source region 214. Besides, further two masks can be waived during the subsequent formation of the contact opening and the body region 224. Therefore, the present invention can reduce the number of masks, the costs of processes and the manpower demands.

On the other hand, the stacked mask structure 210 of the present invention is helpful in forming the body region 224 precisely at the preserved location inside the well region 212, which is considered a self-aligned process. Accordingly, the method is also helpful for accurately defining the opening position for the contact opening to avoid misalignment and abnormal electrical connection. Moreover, since there is no need to preserve the space for misalignment, higher device intensity can be achieved by reducing the preserved boarder for the source region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a power metal oxide semiconductor field effect transistor (MOSFET) comprises:
    forming an epitaxial layer, a gate dielectric layer and a gate layer over the substrate sequentially;
    patterning the gate dielectric layer and the gate layer to form a gate structure and a stacked mask structure, and a surface of a portion of the epitaxial layer is exposed between the gate structure and the stacked mask structure;
    forming a well region in the epitaxial layer and under the stacked mask structure and partially under the gate structure;
    forming a source region inside the well region and between the gate structure and the stacked mask structure using the gate structure and the stacked mask structure as masks;
    forming a patterned dielectric layer to cover the gate structure and the source region, while the patterned dielectric layer exposes an upper surface of the stacked mask structure;
    removing the stacked mask structure to form a contact opening exposing a surface of the well region; and
    forming a body region inside the well region and under the contact opening by using the patterned dielectric layer as a mask.

2. The method as recited in claim 1, wherein the step of forming the patterned dielectric layer comprises:
    forming a dielectric material layer to cover the gate structure, the stacked mask structure and the source region;
    forming a patterned photoresist layer over the dielectric material layer;
    removing the dielectric material layer which is not covered by the patterned photoresist layer to expose the stacked mask structure; and
    removing the patterned photoresist layer.

3. The method as recited in claim 2, wherein a method for removing the dielectric material layer which is not covered by the patterned photoresist layer includes isotropic etching.

4. The method as recited in claim 1, wherein the method for removing the stacked mask structure includes anisotropic etching.

5. The method as recited in claim 1, wherein a material for the patterned dielectric layer is selected from the following group consisting of silicon oxide, silicon nitride, phosphosilicate glass and borophosphosilicate glass.

6. The method as recited in claim 5, wherein the material for the patterned dielectric layer is borophosphosilicate glass, and a thermal flow process is performed to the patterned dielectric layer, after forming the body region inside the well region and under the contact opening.

7. The method as recited in claim 1, wherein the step of patterning the gate dielectric layer and the gate layer includes applying a photolithography and a etching process, respectively.

8. The method as recited in claim 1, wherein a method for forming the well region comprises ion implantation.

9. The method as recited in claim 1, wherein a method for forming the source region comprises ion implantation.

10. The method as recited in claim 1, wherein a method for forming the body region comprises an ion implantation.

11. The method as recited in claim 1, wherein a material for the gate layer comprises polysilicon.

12. The method as recited in claim 1, wherein a method for forming the gate layer comprises chemical vapor deposition.

13. The method as recited in claim 1, wherein a material for the gate dielectric layer comprises silicon oxide.

14. The method as recited in claim 1, wherein a method for forming the gate dielectric layer comprises thermal oxidation.

* * * * *